United States Patent [19]

Deveaud et al.

[11] Patent Number: 4,720,309
[45] Date of Patent: Jan. 19, 1988

[54] SATURATABLE ABSORBANT WITH VERY SHORT SWITCHING TIMES

[76] Inventors: Benoît Deveaud, hh res Duroux, 22300 Lannion; André Chomette, Kerfiet Camlez, 22450 La Roche-Derrien; André Regreny, 17 rue A Camus, 22700 Perros Guirec, all of France

[21] Appl. No.: 883,818
[22] Filed: Jul. 9, 1986
[30] Foreign Application Priority Data Jul. 23, 1985 [FR] France ................... 85 11234

[51] Int. Cl.$^4$ .............. H01L 33/00; H01L 31/06; H01S 3/18
[52] U.S. Cl. .................. 148/33.1; 148/33.4; 148/175; 148/DIG. 65; 148/DIG. 72; 148/DIG. 160; 148/33.5; 437/129; 437/126; 437/133; 357/16; 372/11; 372/18; 372/10
[58] Field of Search ............. 372/45, 47, 48, 50, 372/18, 11; 357/16, 30; 148/33, 33.3, 33.4, 33.5, 33.1; 29/569 L, 572

[56] References Cited

U.S. PATENT DOCUMENTS

| | | | |
|---|---|---|---|
| 3,993,963 | 11/1976 | Logan et al. | 148/33.5 |
| 4,163,237 | 7/1979 | Dingle et al. | 357/16 |
| 4,205,329 | 5/1980 | Dingle et al. | 357/16 |
| 4,205,331 | 5/1980 | Esaki et al. | 357/30 E |
| 4,450,463 | 5/1984 | Chin | 357/30 |
| 4,503,540 | 3/1985 | Nakashima et al. | 372/50 |
| 4,546,480 | 10/1985 | Burnham et al. | 372/50 |
| 4,553,317 | 11/1985 | Sakaki et al. | 29/572 |
| 4,630,083 | 12/1986 | Yamakoshi | 372/45 |
| 4,637,122 | 1/1987 | Carney et al. | 29/569 L |

FOREIGN PATENT DOCUMENTS

| | | |
|---|---|---|
| 0124924 | 4/1984 | European Pat. Off. . |
| 0133342 | 6/1984 | European Pat. Off. . |
| 60-145678 | 9/1984 | Japan . |
| 2131610 | 6/1984 | United Kingdom . |

OTHER PUBLICATIONS

*Appl. Phys. Lett.*, vol. 37, No. 1, Jul. 1980, pp. 15–17, "Induced Phonon–Sideband Laser Operation of Large-Quantum-Well AlxGa$_{1-x}$As–GaAs Heterostructures (L$_z$~200–500 Å)", by J. J. Coleman et al.
*Electronics Letters*, vol. 20, No. 8, Apr. 12, 1984, pp. 320–321, "Superlattice Optical-Cavity Multiple-Quantum-Well (Soc-MQW) Lasers Grown by Molecular-Beam Epitaxy" by H. Sakaki et al.
*Appl. Phys. Lett.* 42(10), May 15, 1983, pp. 864–866, "Electroabsorption by Stark Effect on Room-Temperature Excitons in GaAs/GaAlAs Multiple Quantum Well Structures" by D. S. Chemla et al.
*J. Appl. Phys.* 50(9), Sep. 1979, pp. 5835–5840, "Tunnel Injection and Phonon Assisted Recombination in Multiple Quantum-Well AlxGa$_{1-x}$As-GaAs p-n Heterostructure Lasers Grown by MO—CVD" by B. A. Vojak et al.
*IEEE J. of Quantum Electronics*, vol. QE-16, No. 2, Feb. 1980, "Quantum-Well Heterostructure Lasers" by Nick Holonyak, Jr. et al.
*Optics Communications*, vol. 19, No. 1, pp. 25–27, Oct. 1976, "Absorber-Induced Features in the AC Response of A He-Ne Laser" by J. Seligson et al.
Patents Abstracts of Japan, vol. 8, Mar. 9, 1984; Nippon Denshin Denwa Kosha.
*Applied Physics Letters*, vol. 42, Apr. 1983, pp. 615–617, "Use of a Superlattice to Enhance the Interface Properties Between Two Bulk Heterolayers", T. J. Drummond et al.
*Applied Physics Letters*, vol. 43, Sep. 1983, pp. 585–587, "Growth of GaO.47InO.53 As–InP Quantum Wells by Low Pressure Metalorganic Chemical Vapor Deposition", M. Razeghi et al.

*Primary Examiner*—Brian E. Hearn
*Assistant Examiner*—Chi-Tso Huang
*Attorney, Agent, or Firm*—Oblon, Fisher, Spivak, McClelland & Maier

[57] ABSTRACT

This absorbant is of the type formed by superlattice constituted by a stack of films of two different semiconductor materials having gaps of different heights. Thus, a potential well is produced in each film corresponding to the semiconductor with the smallest gap and a potential barrier in each film corresponding to the semiconductor with the largest gap. This saturatable absorbant is characterized in that the films corresponding to the semiconductor with the smallest gap have a thickness, which can assume two values, one small and the other large.

Application in optics to the production of mode locking lasers and all optical logic gates.

7 Claims, 4 Drawing Figures

SATURATABLE ABSORBANT WITH VERY SHORT SWITCHING TIMES

BACKGROUND OF THE INVENTION

The present invention relates to a saturatable absorbant with very short switching times. It is used in optics, particularly in the production of lasers emitting very short pulse trains and in the production of all optical logic gates.

A saturatable absorbant is a material, whose absorption coefficient significantly decreases when a large amount of light is applied to it. This type of material has numerous applications, reference being made in a non-limitative manner to the production of lasers operating under mode locking conditions and emitting pulse trains of an extremely short width below one picosecond and the production of all optical logic gates, in which a first high power light beam controls the passage or stopping of a second light beam.

Saturatable absorbants have long been constituted by amorphous materials, such as dissolved colouring agents. However, for some years now, interest has been attached to a new class of materials called multiple quantum wells or MQW and to variants of these structures called superlattices.

A quantum well is obtained by inserting between two thin films of a first conductive material a thin film of a second material having a smaller forbidden band or gap than that of the first. In this way a potential well is produced for the charge carriers in the central semiconductor having the smallest gap, said well being surrounded by two potential barriers corresponding to the two extreme films. A multiple quantum well is obtained by superimposing such structures, without there being any coupling between the wells (which is obtained by giving the barriers an adequate thickness).

A superlattice is obtained when the potential barriers are sufficiently thick for there to be a coupling between the different wells. Thus, a superlattice is formed from a stack of films of two different semiconductor materials having gaps of different heights. Potential wells are produced in the films corresponding to the semiconductor with the smallest gap and a potential barrier appears in each film corresponding to the semiconductor with the largest gap.

FIG. 1 diagrammatically illustrates said structure and its properties. It is possible to see in part (a), a stack of films of two semiconductor materials $SC_1$ and $SC_2$. The energy level diagram is shown in part (b), where $G_1$ and $G_2$ represent the gaps separating the valence band at the bottom from the conduction band at the top. It is assumed in FIG. 1 that semiconductor $SC_1$ has the smallest gap and consequently the potential wells are formed in this material. These wells have a width Lp corresponding to the thickness of the corresponding films. In the films of semiconductor $SC_2$ having a thickness Lb are formed the potential barriers. These wells are occupied by electrons in the conduction band and by holes in the valence band.

Numerous publications deal with such superlattices. Reference is e.g. made to two general articles entitled "solid state superlattices" published G. H. DOHLER in Scientific American, November 1983, Vol 249, No 5, pp 144 to 151 and "Les super-reseaux artificiels" published by J. F. PALMER in L'Echo des Recherches, No 105, July 1981, pp 41 to 48. In connection with quantum wells, reference is also made to the article by R. M. KOLBAS et al entitled "Man-made quantum wells: a new perspective on the finite square-well problem" published in the American Journal of physics, 52 (5), May 1984, pp 431–437.

Such materials have a double structural perodicity, one due to the crystalline structure of the semiconductors used and the other due to the regular stacking of the films. Thus, both in the valence band and in the conduction band there are discrete energy levels (or microbands) which are offered to the holes and electrons. FIG. 1 diagrammatically shows a level Ee in the conduction band, which can be occupied by an electron (e) and a level Eh located in the valence band, which can be occupied by a hole (h).

The position of these energy levels is obviously dependent on the materials used and on the thickness of the films.

There is great interest in such structures. This has increased since it was found that they had saturatable absorption lines. Absorption taken place in the films corresponding to the semiconductor with the smallest gap, where the wells are located. Since this discovery these devices have been used in mode locking lasers. Thus, it has been possible to produce a semiconductor laser emitting a pulse train of width equal to 1.3 ps with a recurrence frequency equal to 1 GHz. The passive locking process is obtained as a result of a external resonant cavity and a superlattice of the multiple quantum well type bonded to one of the mirrors of the cavity. This is described in the article by Y. SILBERBERG et al entitled "Passive mode locking of a semiconductor diode laser" published in Optics Letters, November 1984, Vol 9, No 11, pp 507–509. These devices have also been used in optical logics. It has been possible to produce a logic NOR gate having a switching time below 1 picosecond. Such an application is described in the article by A. MIGUS et al entitled "One-picosecond optical NOR gate at room temperature with a GaAs-AlGaAs multiple-quantum-well non linear Fabry-Perot etalon" published in Applied Physics Letters, 46 (1), January 1985, pp 70–72.

The establishment of the phenomena involved in these applications is extremely short and is approximately or less than 1 picosecond, which is the switching time which can be called "on" and which represents the absorption saturation. However, the return to equilibrium, which characterises a switching time which can be called "off" is much longer and is approximately 1 nanosecond.

It is widely accepted that it is the latter time which essentially limits the performances of such devices. Various solutions have been proposed for obviating this deficiency and particularly the irradiation of the absorbant by electrons, which reduces the radiative life in the structure and therefore the return to equilibrium time. However, this is difficult and complex to carry out.

SUMMARY OF THE INVENTION

The invention has the same objective of reducing the "off" switching time, but uses a quite different and much simpler means. According to the invention, instead of giving the different wells identical widths, they are given different widths, some being wide and others narrow. A certain number of wide wells can alternate with a certain number of narrow wells. In an advantageous variant, every other well is wide and every other well narrow. The saturatable absorption is obtained in the narrow wells, whilst the wide wells are used for collecting the photoexcited carriers produced in the adjacent narrow wells.

In the present invention, a wide well is a well having a width between 9 and 25 nm and a narrow well is a well having a width between 5 and 9 nm. These wells are separated by barriers having a width between 5 and 9 nm.

The introduction of an enlarged well into a superlattice has already formed the subject matter of publications, e.g. the article A. CHOMETTE et al entitled "Enlarged Wells as Probes for Study Superlattices", published in Superlattices and Microstructures, Vol 1, No 3, 1985, Academic Press.

The introduction of an enlarged well has the effect of producing therein, one or more energy levels below the lowest energy level of the conduction band and above the highest energy level of the valence band. Thus, the carriers tend to accumulate in the wide well or wells over low energy levels.

The application according to the invention of said phenomenon to the reduction of the recovery time of the saturatable absorption can then be explained in the following way.

What prevents the restoration of the absorption in a prior art device is the presence of a large number of hot carriers. These excess carriers only thermalize slowly before recombining even more slowly. In the structure according to the invention, the carriers are trapped extremely rapidly in the wide wells. If the precaution is taken of ensuring that the wide wells are definitely wider (at least 1.5 and preferably 2.5 times) than the narrow wells, a high energy difference is obtained of approximately 50 meV between the electronic confinement levels in said two types of wells (and also for the levels offered to the holes). Although the thermalization and radiative recombination in the wide wells is not faster than in the narrow wells, the hot carriers are maintained in the wide wells and no longer prevent the formation of excitons in the narrow wells.

The major consequence is that the mean restoration time of the excitonic absorption following the stopping of the control excitation is limited by the sum two characteristic times, namely the trapping time in the enlarged wells which, in a structure according to the invention is extremely short, there being no difficulty in obtaining times well below 1 ps and the cooling time of the carriers trapped at an electronic temperature below that at which they could be reemitted in the narrow wells.

It should be noted that the cooling of hot carriers takes place by two mechanisms having very different characteristic times:

(a) diffusion by optical phonons, which is extremely fast (below 1 ps), but can only occur when the carriers have an energy above 36 meV;

(b) when the carriers have an energy below 36 meV, the relaxation is controlled by interaction with acoustic phonons and is much slower.

In order that the cooling time is not prejudicial, it is necessary for the electronic levels in the wells of each of the widths to be spaced by more than roughly 40 meV, which is the case in the structure according to the invention.

Thus, by using the device according to the invention, it is possible to obtain extremely short on and off switching times (typically 1 ps), which opens the door to very important applications.

More specifically, the present invention relates to an absorbant with saturatable absorption and low switching times, constituted by a superlattice formed by a stack of films of a first semiconductor material having a first forbidden band (gap) and a second conductor material having a second forbidden band (gap) which is wider than the first, a potential well being produced in each film corresponding to the first semiconductor and a potential barrier in each film corresponding to the second semiconductor, the films corresponding to the first semiconductor having a thickness assuming two values, one large and the other small, the large thickness being between 9 and 25 nm and the small thickness between 5 and 9 nm, the saturatable absorption of a radiation occurring in the films of the first semiconductor having a small thickness and a rapid restoration of this absorption occurs in the films of the first semiconductor having a large thickness.

Preferably the large and small thicknesses of the wells are in a ratio R exceeding 1.5. Advantageously, the ratio R is between 2 and 3 (e.g. 2.5).

BRIEF DESCRIPTION OF THE DRAWINGS

The invention is described in greater detail hereinafter relative to non-limitative embodiments and the attached drawings, wherein show.

Figure 1:
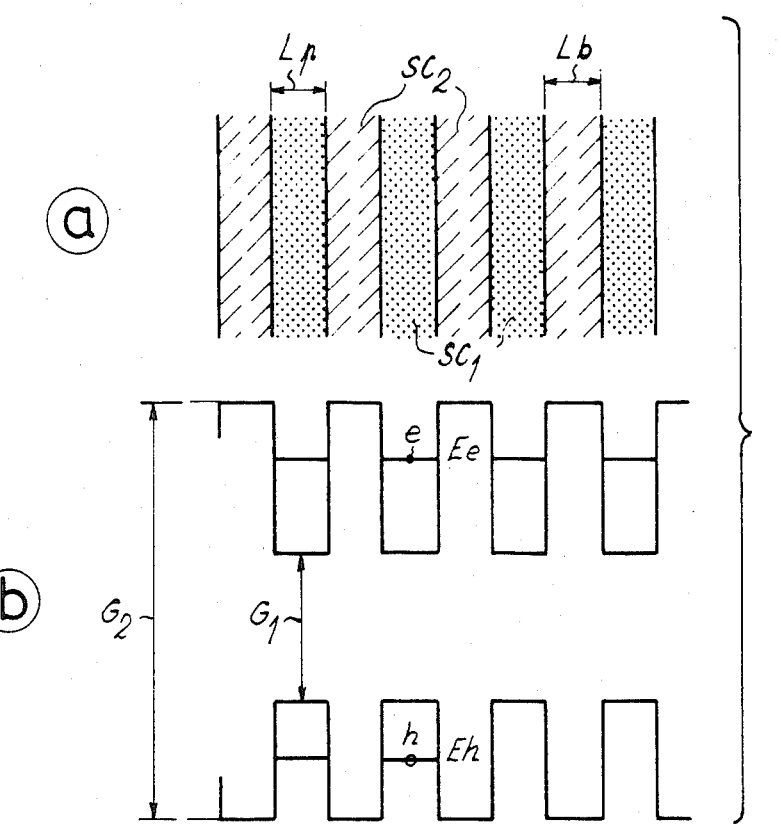
FIG. 1, already described, diagrammatically a superlattice according to the prior art.
Figure 2:
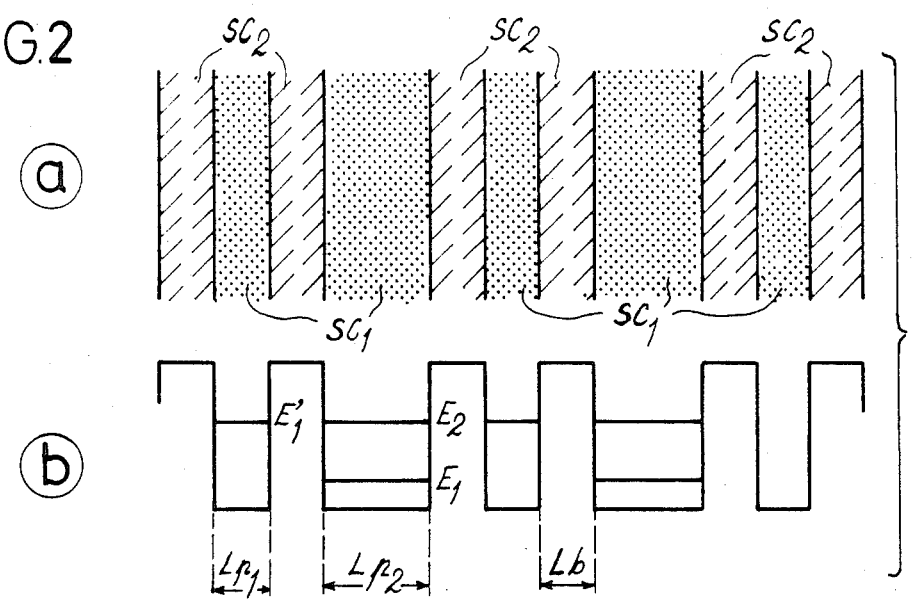
FIG. 2, a superlattice according to the invention.

In part (a) of FIG. 2, it is possible to see a stack of films of two semiconductor materials $SC_1$ and $SC_2$, the thickness of the films of $SC_2$ always being the same, but the thickness of the films of $SC_1$ is equal either to a low value $Lp_1$, or to a high value $Lp_2$. In part (b), it is possible to see the energy level diagram of the conduction band (the valence band is not shown, but it has a similar, but symmetrical configuration). Barriers of width Lb separate the wells of alternate widths $Lp_1$ and $Lp_2$. In the wide wells, the lowest energy level $E_1$ is below the level $E'_1$, which is the lowest level in the narrow wells.

The materials which can be used according to the invention are those encountered in the production of multiple quantum wells and other superlattices. Favoured materials are GaAs, AlAs $Ga_{1-x}Al_xAs$. In the latter case, the parameter x (which is between 0 and 1) makes it possible to regulate the height of the gap knowing that the more x increases, the more the band is widened. Generally x is between 0.2 and 0.4.

The Applicants have produced and studied absorbants according to this principle in two cases:

EXAMPLE 1

Lb = 5 nm
$Lp_1$ = 5 nm
$Lp_2$ = 12.7 nm
$SC_1$ = GaAa
$SC_2$ = $Ga_{1-x}Al_xAs$ with x = 0.30

EXAMPLE 2

Lb = 7 nm
$Lp_1$ = 6.5 nm
$Lp_2$ = 15.5 nm
$SC_1$ = GaAs
$SC_2$ = $Ga_{1-x}Al_xAs$ with x = 0.30

Samples according to these two examples have been studied by the Applicants with the aid of various experimental techniques and the following characteristics have been verified. The trapping time in the wide wells is extremely short. In both samples, the excitonic absorption corresponding to the narrow well persists at 300 K. However, it is weaker in sample 1, but the latter has a shorter trapping time. Thus, there must be an equilibrium effect between the quality of the absorption at 300 K and the off switching time. Conversely the excitonic resonance persists at 300 K in the samples of the second example having a wider gap and the trapping time still remains extremely short.

By using the saturatable absorbant according to the invention, it is possible to considerably improve the devices described hereinbefore. In the case of a mode locking laser, it is possible to operate at frequencies above 100 Ghz (which makes it necessary to produce a cavity with a length of less than 3 mm. In the case of an optical gate, it is possible to reach a recurrence frequency up to 1000 Gbit/sec.

Other structures can obviously be used for giving the same effect, e.g. the number of wide wells may not be equal to half the wells and instead proportions of ⅓, ¼ etc can be envisaged. It is also possible to produce structures, where the narrow well is formed from an alloy $Ga_{1-x}Al_xAs$ with x being low (the well could then be wider).

It is also possible to improve the efficiency of the transfer by bringing into resonance the fundamental level $E_1'$ of the narow well and one of the levels of the wide well $E_2$ for example. This is carried out in the samples and shown in FIG. 2.

It is finally pointed out that superlattice structures are already known in which narrow wells alternate with wide wells. This is the case in certain semiconductor lasers, like that described by H. Sakaki et al in Electronics Letters, Apr. 12, 1984, Vol 20, No 8, pp 320-321. However, it is necessary to understand that the dimensions and consequently the phenomena differ. In an optical cavity like that described in the aforementioned document, the narrow wells have a width less than 1 nanometer, which is ten times less than in the present invetion. It is out of the question in such a well for a saturatable absorption phenomenon to occur, because the carriers move too fast. Thus, these narrow wells only lead to the participation of barriers in superlattice form and which separate the wells. The width of these wells is roughly the same as that of the barriers. It is typically 2.7 nm, i.e. it is very narrow compared with the barriers used in the invention.

What is claimed is:

1. An absorbant with saturatable absorption and low switching times, comprising a superlattice formed by a stack of films of a first semiconductor material having a first forbidden band gap and a second semiconductor material having a second forbidden band gap which is wider than the first, a potential well being produced in each film corresponding to the first semiconductor and a potential barrier in each film corresponding to the second semiconductor, a plurality of films corresponding to the first semiconductor having a large thickness and the remaining films corresponding to the first semiconductor having a small thickness, the large thickness being between 9 and 25 nm and the small thickness between 5 and 9 nm, at least one film with a large thickness alternating with at least one film with a small thickness, said saturatable absorption of radiation occurring in the films of the first semiconductor having said small thickness and a rapid restoration of the absorption occurring in the films of the first semiconductor having said large thickness.

2. The saturatable absorbant according to claim 1, wherein the large thickness and small thickness of the films of the first semiconductor are in a ratio exceeding 1.5.

3. The saturatable absorbant according to claim 2, wherein the large thickness and small thickness of the films of the first semiconductor are in a ratio between 2 and 3.

4. The saturatable absorbant according to claim 1, wherein the thin films of the first semiconductor alternate with the thick films of the first semiconductor.

5. The saturatable absorbant according to claim 1, wherein the first and second semiconductors are made from $Ga_{1-x}Al_xAs$ with x=0 for the first and x between 0.2 and 0.4 for the second.

6. The saturatable absorbant according to claim 1, wherein the fundamental level of a limited width well is in resonance with one of the levels of a large width well.

7. The saturatable absorbant according to claim 1, wherein the films of small and large thickness alternate with each other throughout the structure of said absorbant.

* * * * *